United States Patent
Peterson et al.

(10) Patent No.: US 10,833,025 B2
(45) Date of Patent: Nov. 10, 2020

(54) COMPRESSIVE ZONE TO REDUCE DICING DEFECTS

(71) Applicant: INTERNATIONAL BUSINESS MACHINES CORPORATION, Armonk, NY (US)

(72) Inventors: Kirk D. Peterson, Jericho, VT (US); Thomas A. Wassick, LaGrangeville, NY (US); Nicolas Pizzuti, Waterbury, VT (US); Thomas M. Shaw, Peekskill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/372,323

(22) Filed: Apr. 1, 2019

(65) Prior Publication Data

US 2020/0312788 A1 Oct. 1, 2020

(51) Int. Cl.
*H01L 23/00* (2006.01)
*H01L 21/768* (2006.01)
*H01L 23/58* (2006.01)

(52) U.S. Cl.
CPC ...... *H01L 23/562* (2013.01); *H01L 21/76837* (2013.01); *H01L 23/585* (2013.01)

(58) Field of Classification Search
CPC ................ H01L 23/562; H01L 23/585; H01L 21/76837
See application file for complete search history.

(56) References Cited

U.S. PATENT DOCUMENTS

| | | | |
|---|---|---|---|
| 7,572,738 B2 | 8/2009 | Nogami | |
| 7,955,952 B2 | 6/2011 | Liu et al. | |
| 8,237,246 B2 | 8/2012 | Angyal et al. | |
| 8,937,011 B2 | 1/2015 | Iuchi et al. | |
| 9,608,026 B2 | 3/2017 | Park et al. | |
| 9,831,194 B1 | 11/2017 | Lee et al. | |
| 2006/0027924 A1 | 2/2006 | Chen et al. | |
| 2011/0193197 A1 | 8/2011 | Farooq et al. | |
| 2015/0171025 A1* | 6/2015 | Shao | H01L 21/2633 257/774 |
| 2015/0194390 A1 | 7/2015 | Huang et al. | |
| 2017/0062355 A1* | 3/2017 | Liang | H01L 23/562 |
| 2018/0182671 A1 | 6/2018 | Huang et al. | |

OTHER PUBLICATIONS

"Novel BLM Final Via Structure for C4 Crackstop, Crack Sensor, and Wiring", An IP.com Prior Art Database Technical Disclosure, IBM, IP.com No. IPCOM000183894D, Jun. 4, 2009.

* cited by examiner

*Primary Examiner* — Anthony Ho
(74) *Attorney, Agent, or Firm* — Law Offices of Ira D. Blecker, P.C.

(57) ABSTRACT

A semiconductor device that includes a substrate having integrated circuits; a plurality of metallization layers on the substrate, the plurality of metallization layers having a peripheral region adjacent to a kerf region of the semiconductor device and containing a crack stop structure extending through the plurality of metallization layers; a trench extending through the plurality of metallization layers and adjacent to the crack stop structure, the trench filled with a material that creates compressive stresses between the filled trench and the adjacent metallization layers to form a compressive zone adjacent to the crack stop structure. Also disclosed is a method for forming the semiconductor device.

11 Claims, 6 Drawing Sheets

COMPRESSIVE ZONE TO REDUCE DICING DEFECTS

BACKGROUND

The present exemplary embodiments pertain to the manufacture of semiconductor devices and, more particularly, to a crack stop structure for mitigating crack formation in the semiconductor devices during singulation.

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

Dozens or hundreds of semiconductor devices are typically manufactured on a single semiconductor wafer. The individual die are singulated by sawing the semiconductor devices along a scribe line in a kerf region. The individual die are then packaged, either separately or in a multi-chip module or other type of packaging, for example.

A problem that may occur in semiconductor devices is that when the die are singulated, the material layers can crack proximate the scribe line in the kerf region, damaging the integrated circuits within the semiconductor devices and leading to device failures. The cracks can disrupt conductive lines, for example, rendering the circuits inoperable. The cracks can also allow moisture and other contaminants to enter into the integrated circuit, causing corrosion, for example. The cracks may occur during the singulation and packaging process and may further propagate due to stress during the life of the part. The cracks present both a yield issue during manufacture and a reliability issue during the life of the part, both of which motivate a better solution.

BRIEF SUMMARY

The various advantages and purposes of the exemplary embodiments as described above and hereafter are achieved by providing, according to an aspect of the exemplary embodiments, a semiconductor device comprising: a substrate having integrated circuits; a plurality of metallization layers on the substrate, the plurality of metallization layers having a peripheral region adjacent to a kerf region of the semiconductor device and containing a crack stop structure extending through the plurality of metallization layers; a trench extending through the plurality of metallization layers and adjacent to the crack stop structure, the trench filled with a material that creates compressive stresses between the filled trench and the adjacent metallization layers to form a compressive zone adjacent to the crack stop structure.

According to another aspect of the exemplary embodiments, there is provided a semiconductor device comprising: a substrate having integrated circuits; a plurality of metallization layers comprising alternating layers of metal and dielectric on the substrate, the plurality of metallization layers having a peripheral region adjacent to a kerf region of the semiconductor device and containing a crack stop structure extending through the plurality of metallization layers, the crack stop structure comprising a plurality of vertically aligned and stacked metal-filled vias; a trench extending through the plurality of metallization layers and adjacent to the crack stop structure, the trench filled with a material that creates compressive stresses between the filled trench and the adjacent metallization layers to form a compressive zone adjacent to the crack stop structure.

According to a further aspect of the exemplary embodiments, there is provided a method of reducing dicing defects in a semiconductor device comprising a substrate having integrated circuits and metallization layers on the substrate, the method comprising: forming a peripheral region in the metallization layers adjacent to a kerf region of the semiconductor device; forming a crack stop structure comprising a plurality of stack vias extending through the metallization layers in the peripheral region; forming a trench in the peripheral region extending through the plurality of metallization layers and adjacent to the crack stop structure; filling the trench with a material that creates a compressive stress between the trench and the adjacent metallization layers to form a compressive zone adjacent to the crack stop structure.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 8 to 10 are cross sectional views illustrating an exemplary method of forming a crack stop structure having compressive zones wherein;

FIG. 8 is a cross sectional view illustrating a crack stop structure including two via stacks;

FIG. 9 is a cross sectional view of the structure of FIG. 8 after forming two trenches adjacent to the two via stacks; and FIG. 10 is a cross sectional view of the structure of FIG. 9 after filling the trenches with a material that will create a compressive stress between the filled trenches and the surrounding material.

FIGS. 11 to 13 are cross sectional views illustrating another exemplary method of forming a crack stop structure having compressive zones wherein;

FIG. 11 is a cross sectional view illustrating a crack stop structure including two via stacks and two trenches having a protective liner;

FIG. 12 is a cross sectional view of the structure of FIG. 11 after depositing an ion exchangeable glass in the two trenches; and FIG. 13 is a cross sectional view of the structure of FIG. 12 after removing the protective liner from areas outside of the trenches.

FIGS. 14 to 16 are cross sectional views illustrating a further exemplary method of forming a crack stop structure having compressive zones wherein;

FIG. 14 is a cross sectional view illustrating a crack stop structure including two via stacks and two trenches having a protective liner;

FIG. 15 is a cross sectional view of the structure of FIG. 14 after depositing an ion exchangeable glass in the two trenches and a subsequent layer of potassium oxide; and FIG. 16 is a cross sectional view of the structure of FIG. 15 after removing the protective liner and the potassium oxide layer from areas outside of the trenches.

DETAILED DESCRIPTION

Semiconductor devices include a semiconductor substrate in which the front end of the line components may be formed. On top of the semiconductor substrate may be formed metallization layers comprising alternating layers of metallization and insulation material. Dicing-induced cracks may propagate through a crack stop at the metallization layers which may lead to electrical fails.

Dicing optimization to reduce initial crack formation is only a mitigation but not a solution.

The exemplary embodiments pertain to an enhanced crack stop structure in which a compressive stress is engineered into or around the crack stop so that a crack will not have enough energy to propagate through the crack stop.

Figure 1:
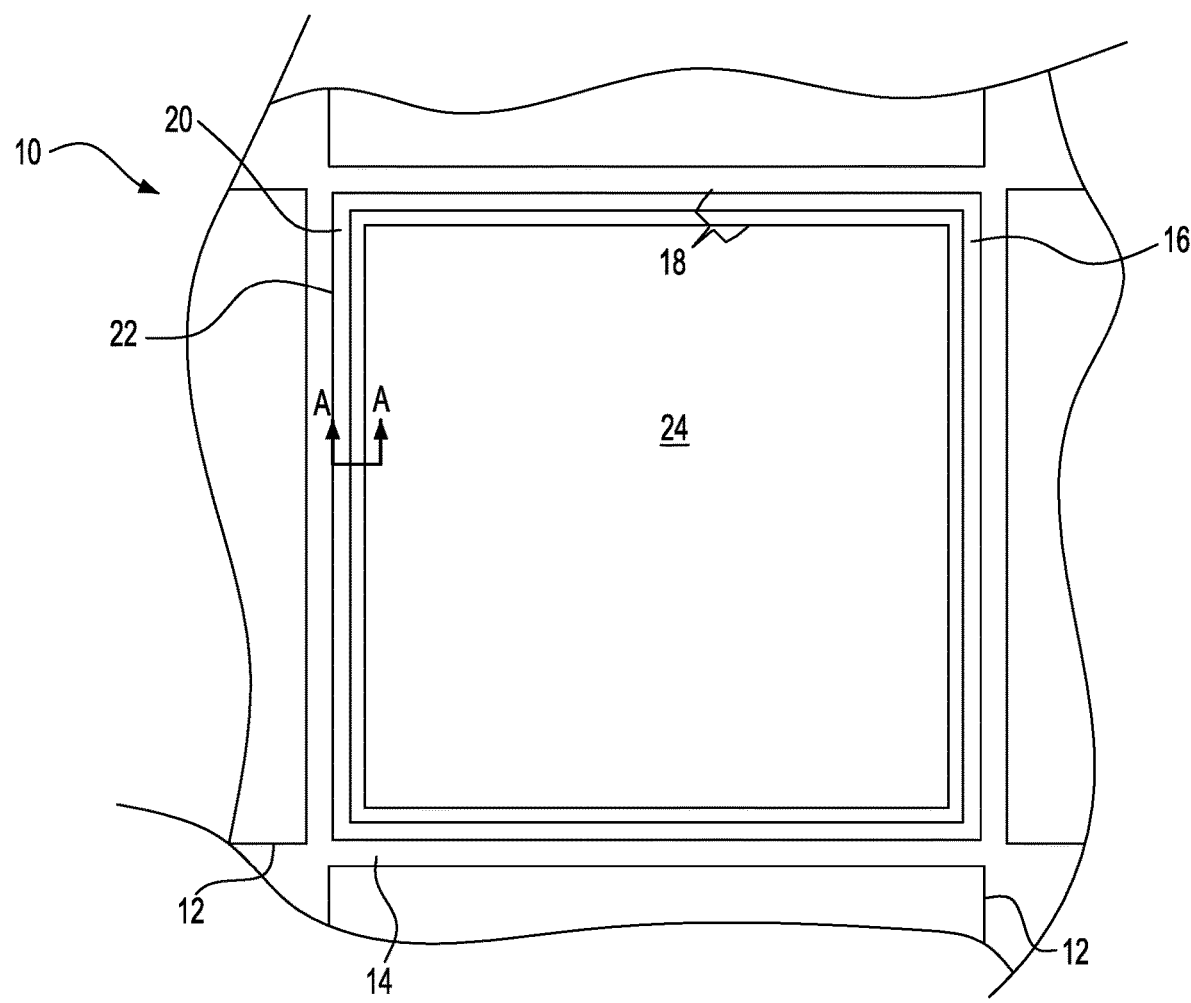
FIG. 1 is a plan view of a semiconductor wafer having a plurality of semiconductor devices.

Referring to the Figures in more detail, and particularly referring to FIG. 1, there is shown a plan view of a partial semiconductor wafer 10 having a plurality of semiconductor devices 12. Located between the semiconductor devices 12 is a kerf region 14 through which the semiconductor devices 12 may be separated in a singulation process.

One particular semiconductor device 16 is shown with greater detail to illustrate a crack stop structure 18. The other semiconductor devices 12 may also have the crack stop structure 18 but the crack stop structure is not shown for clarity. The crack stop structure 18 preferably extends around the entire periphery of the semiconductor device 16 and preferably is continuous around the entire periphery of the semiconductor device 16. The purpose of the crack stop structure 18 is to stop the propagation of cracks and thus performs no electrical function. The cracks can disrupt function in at least 2 ways, first by physically breaking the integrated circuits or secondly if the crack breaks through the crackstop this can allow moisture (which can create corrosion) or mobile ions (which can change the threshold voltages of the devices) into the area of the integrated circuits.

There may be a space 20 between the crack stop structure 18 and the edges 22 of the semiconductor device 16. Located in the central portion 24 of the semiconductor device 16 are the integrated circuits which perform the electrical function of the semiconductor device 16 but are not shown here for clarity.

Figure 2:
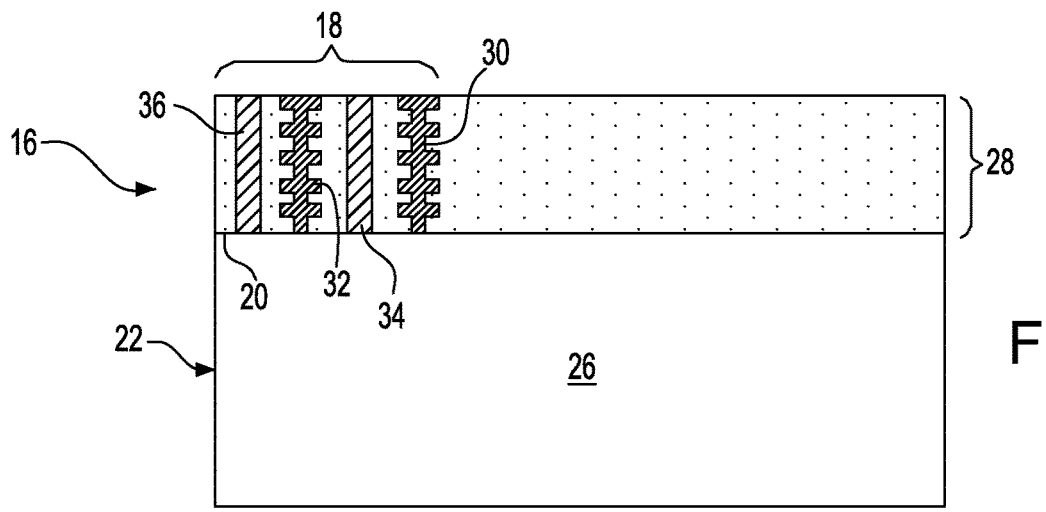
FIG. 2 is a cross sectional view of one exemplary embodiment having a crack stop structure including two via stacks and two compressive zones.

Referring now to FIG. 2, there is illustrated a cross sectional view of an exemplary embodiment of the crack stop structure 18 in FIG. 1 in the direction of arrows A-A in FIG. 1.

Semiconductor substrate 26 contains the front end of the line components and has a plurality of metallization layers 28 comprising alternating layers of a metal and a dielectric material including, but not limited to, silicon dioxide, silicon nitride or a low-k (low dielectric constant) material such as SiCOH. For clarity, the individual layers of the plurality of metallization layers 28 are not shown. The crack stop structure 18 is located within the periphery of the semiconductor device 16 and is comprised of a peripheral portion of the metallization layers 28.

The crack stop structure 18 contains one or more stacks of vias, hereafter referred to as via stacks, that extend through the plurality of metallization layers 28. The stacked vias are made up of a plurality of vias with each stacked via being formed in one or two metallization layers by conventional processing. In the embodiment of FIG. 1, there are two spaced apart via stacks, 30, 32. To enhance the effectiveness of the via stacks 30, 32, compressive zones 34, 36 may be formed in the metallization layers 28. As explained in more detail hereafter, the compressive zones 34, 36 may be formed by forming trenches adjacent to the via stacks 30, 32 and then filling the trenches with a material that will exert a compressive stress on the surrounding metallization layer. As shown in FIG. 2, compressive zone 34 is located between via stacks 30, 32 while compressive zone 36 is located between the edge 22 of the semiconductor device 16 and via stack 32.

The embodiment shown in FIG. 2 is the most preferred embodiment but there are other embodiments that may achieve the advantages of the exemplary embodiments.

Figure 3:
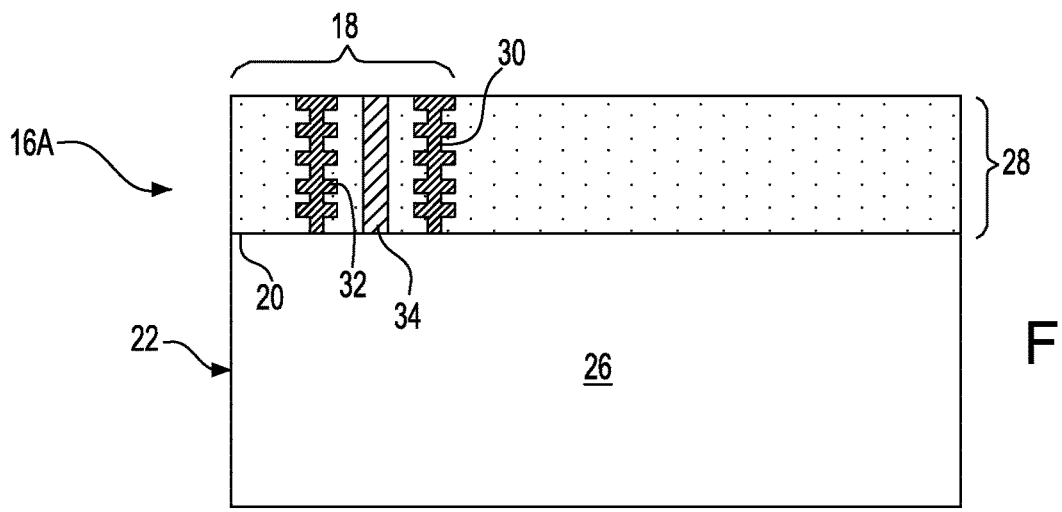
FIG. 3 is a cross sectional view of another exemplary embodiment having a crack stop structure including two via stacks and one compressive zone.

FIG. 3 shows one exemplary embodiment in which semiconductor device 16A has via stacks 30, 32 and only one compressive zone 34 located between via stacks 30, 32.

Figure 4:
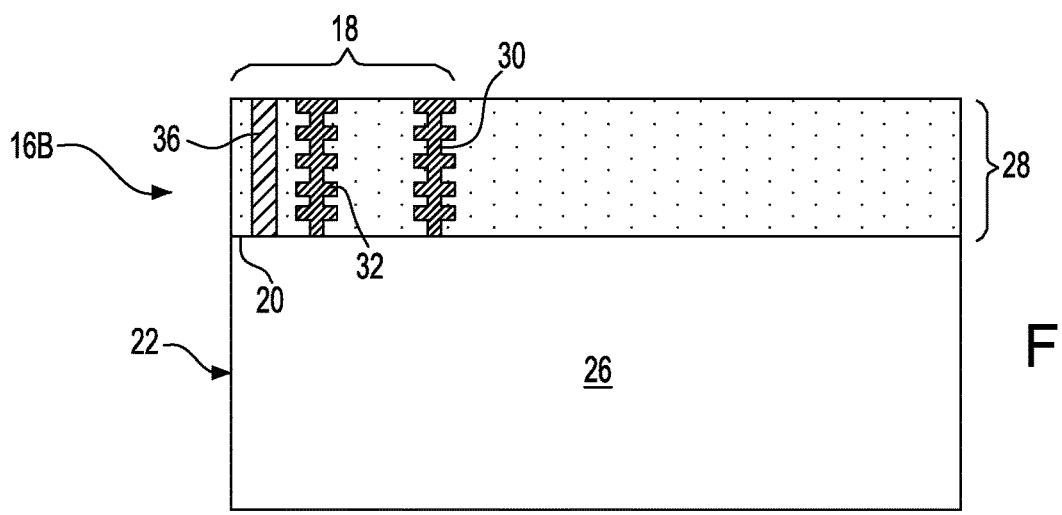
FIG. 4 is a cross sectional view of a further exemplary embodiment having a crack stop structure including two via stacks and one compressive zone.

FIG. 4 shows one exemplary embodiment in which semiconductor device 16B has via stacks 30, 32 and only one compressive zone 36 located between the edge 22 of the semiconductor device 16B and via stack 32.

Figure 5:
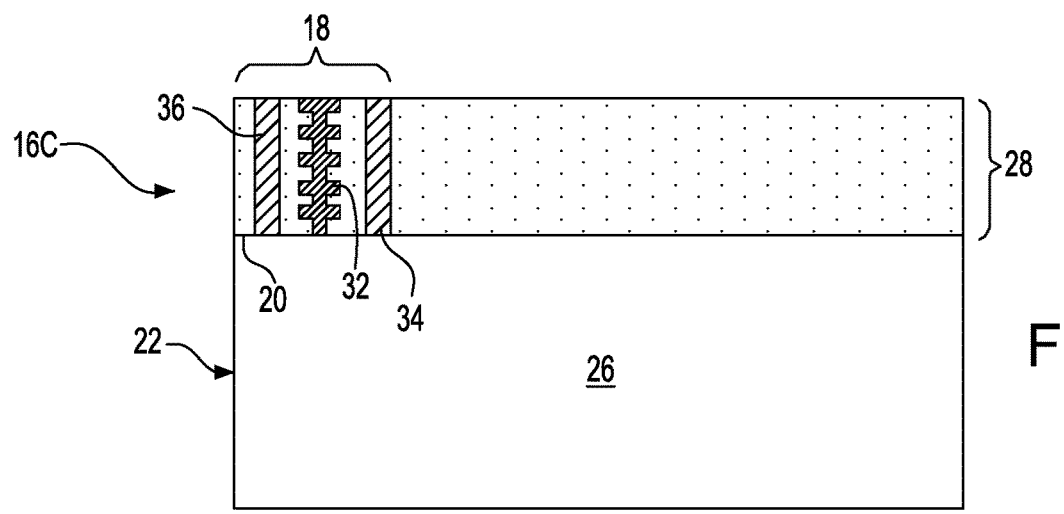
FIG. 5 is a cross sectional view of a still further exemplary embodiment having a crack stop structure including one via stack and two compressive zones.

FIG. 5 shows one exemplary embodiment in which semiconductor device 16C has only one via stack 32 and a compressive zone 34, 36 on either side of the via stack 32 with one compressive zone 36 located between the edge 22 of the semiconductor device 16C and via stack 32.

Figure 6:
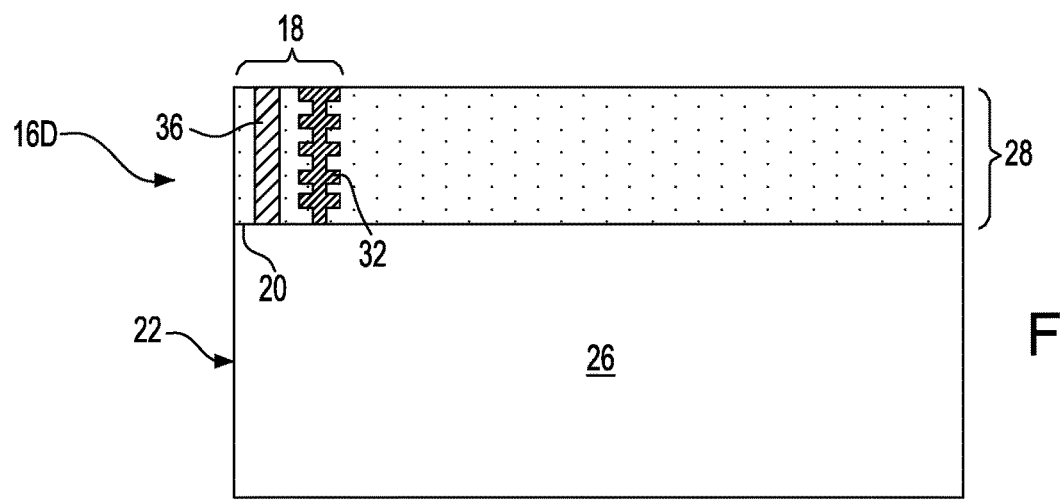
FIG. 6 is a cross sectional view of yet another exemplary embodiment having a crack stop structure including one via stack and one compressive zone.

FIG. 6 shows one exemplary embodiment in which semiconductor device 16D has only one via stack 32 and only one compressive zone 36 located between the edge 22 of the semiconductor device 16B and via stack 32.

Figure 7:
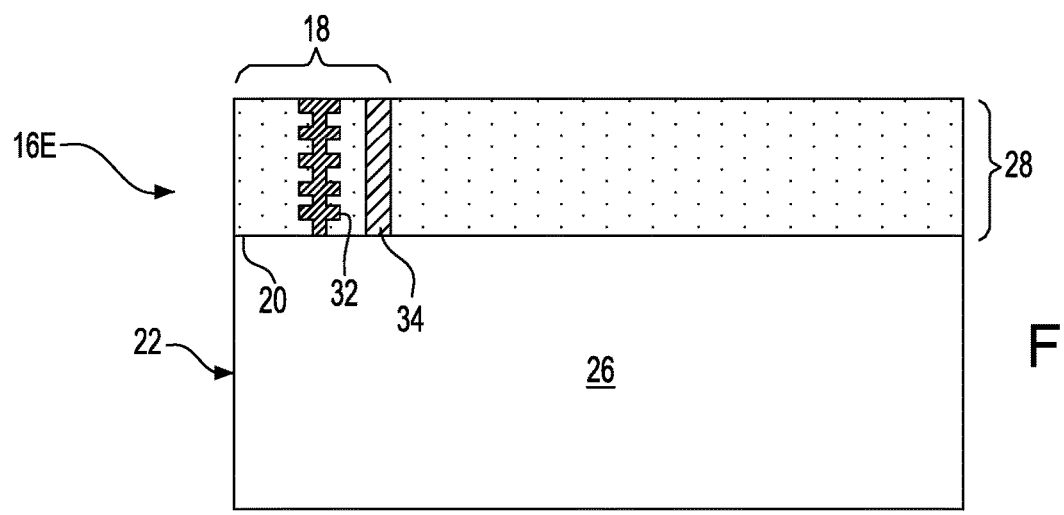
FIG. 7 is a cross sectional view of one more exemplary embodiment having a crack stop structure including one via stack and one compressive zone.

FIG. 7 shows one exemplary embodiment in which semiconductor device 16E has only one via stack 32 and only one compressive zone 34 with the compressive zone 34 being located on the side of the via stack 32 away from the edge 22 of the semiconductor device 16E.

Figure 8:
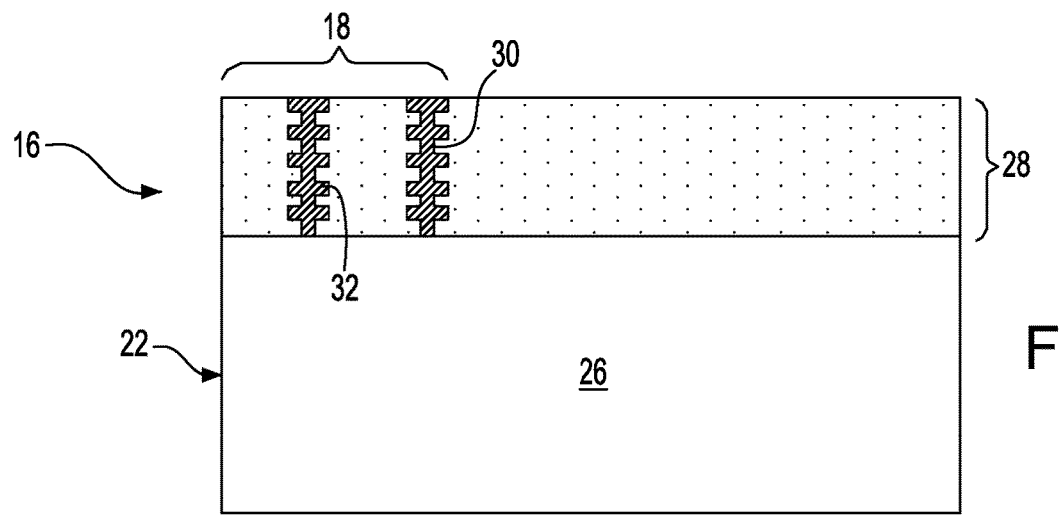
Figure 9:
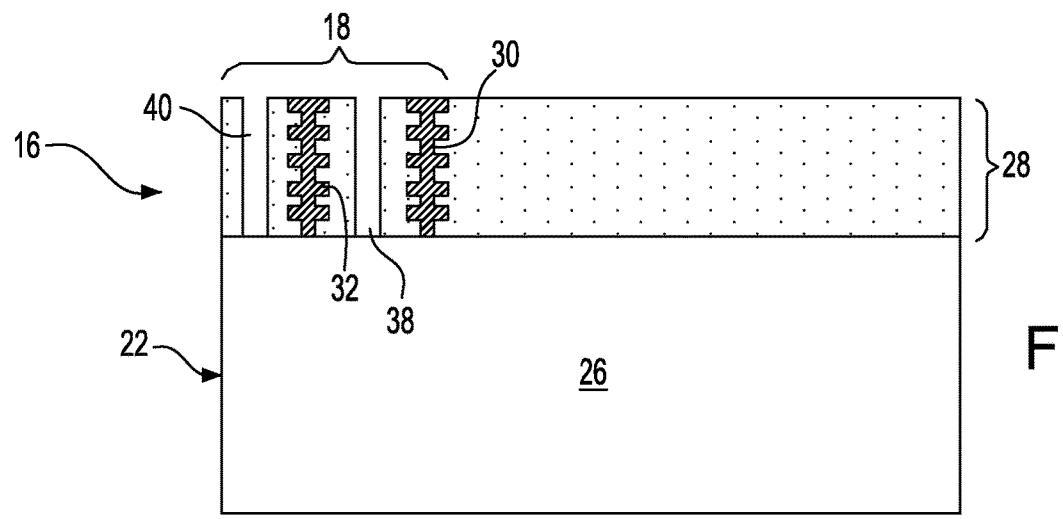
Figure 10:
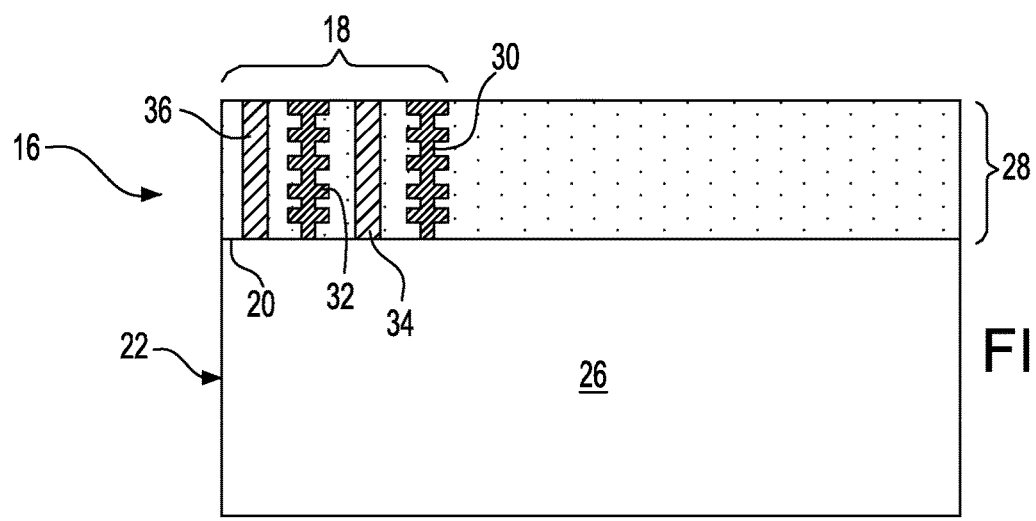

Referring now to FIGS. 8 to 10 there is illustrated a process for forming the semiconductor device 16 shown in FIG. 2. It should be understood that similar processing may be used to form the other semiconductor devices 16A-16E shown in FIGS. 3 to 7.

In FIG. 8, semiconductor device 16 has been formed comprising a semiconductor substrate 26 having a plurality of metallization layers 28. Via stacks 30, 32 may be formed as each metallization layer of the plurality of metallization layers 28 is formed.

In FIG. 9, trenches 38, 40 have been formed, for example by doing a traditional oxide reactive ion etch process, through the plurality of metallization layers 28.

In FIG. 10, the trenches 38, 40 are filled with a material that creates compressive stresses on the adjacent metallization layers to form a compressive zone adjacent to the crack stop structure. The result is compressive zones 34, 36.

In one exemplary embodiment, the filling material may be a dielectric material, such as an oxide or a silicon nitride that has a lower coefficient of thermal expansion than the surrounding material. The difference in coefficients of thermal expansion will cause a compressive stress because the dielectric deposition processes are often done at temperatures in the 200 to 400° C. range, so when the newly deposited material (oxide or silicon nitride) and the surrounding dielectrics used in the construction of the semiconductor chip cool, the newly deposited material (oxide or nitride) will shrink less than the surrounding material creating a compressive stress in the newly filled trench.

In one example, the surrounding dielectric may be silicon nitride having a coefficient of thermal expansion of 3.27 E-6 and the filling material may be a silicon oxide having a coefficient of thermal expansion of 1.0 E-6. The coefficient of thermal expansion of the silicon oxide may be varied by varying the method of deposition.

In one exemplary embodiment, the filling material may be an ion exchangeable glass in which potassium or sodium ions may be exchanged into the glass to make the glass compressive.

For example, the ion exchangeable glass may be submersed in a bath containing a potassium salt (typically potassium nitrate) at around 300° C. which causes sodium ions in the glass surface to be replaced by potassium ions from the bath solution. These potassium ions are larger than the sodium ions and therefore wedge into the gaps left by the smaller sodium ions when they migrate to the potassium nitrate solution. This replacement of ions causes the surface of the glass to be in a state of compression and the core in compensating tension.

Figure 11:
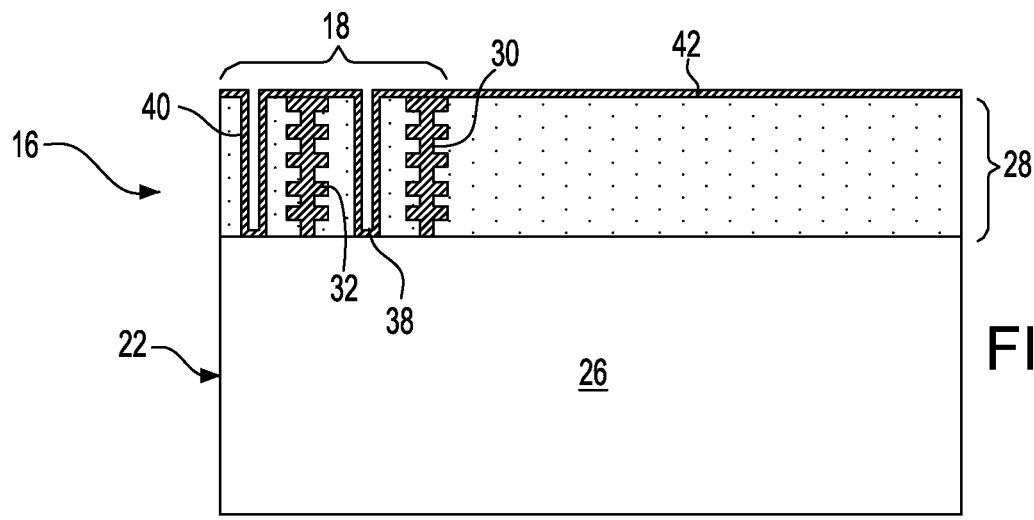
Figure 12:
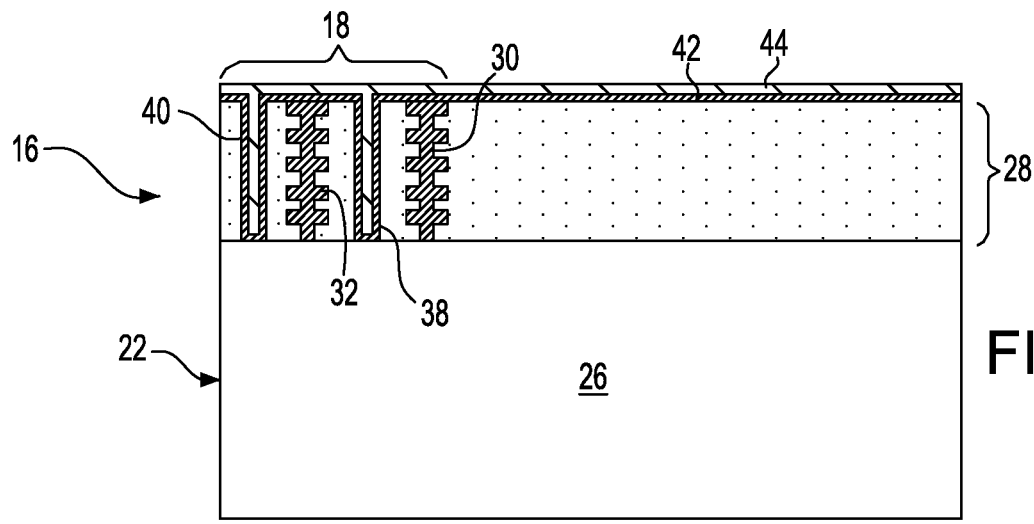
Figure 13:
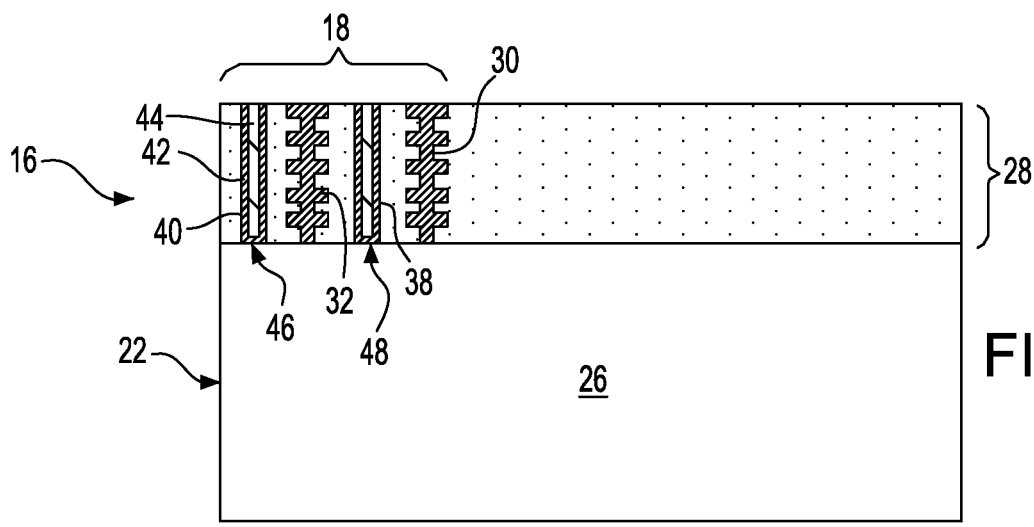

A preferred implementation of this exemplary embodiment is illustrated in FIGS. 11 to 13. For the purpose of illustration and not limitation, semiconductor device 16 is used to illustrate this preferred implementation but it should be understood that the other semiconductor devices 16A-E could also be used. In FIG. 11, semiconductor device 16 has each of the trenches 38, 40 previously described lined with a barrier material 42 such as silicon nitride. The metallization layers 28 may similarly have the barrier layer 42 on top of the metallization layers 28. The barrier layer 42 may be desirable to prevent contamination of the dielectric material in the metallization layers 28 and the semiconductor material in the semiconductor substrate 26 from contamination by the ion exchangeable glass.

In FIG. 12, an ion exchangeable glass 44 containing sodium ions has been deposited in the trenches 38, 40 and over the barrier layer 42. It is preferred that the ion exchangeable glass 44 has 8 weight % or more of $Na_2O$ and 8 weight % or less of CaO.

After immersion in a bath containing a potassium salt such as potassium nitrate that is heated to about 300° C., the potassium ions in the bath may exchange with the sodium ions in the ion exchangeable glass 44. After removal from the bath, the surface of the metallization layers 28 may be planarized to remove the over layers of barrier 42 and ion exchangeable glass 44. The resulting structure is shown in FIG. 13 comprising compression zones 46, 48 formed by the ion exchangeable glass 44.

In another exemplary embodiment, if the glass already has the potassium or sodium ions, the glass may be thermally treated to diffuse the ions laterally.

Figure 14:
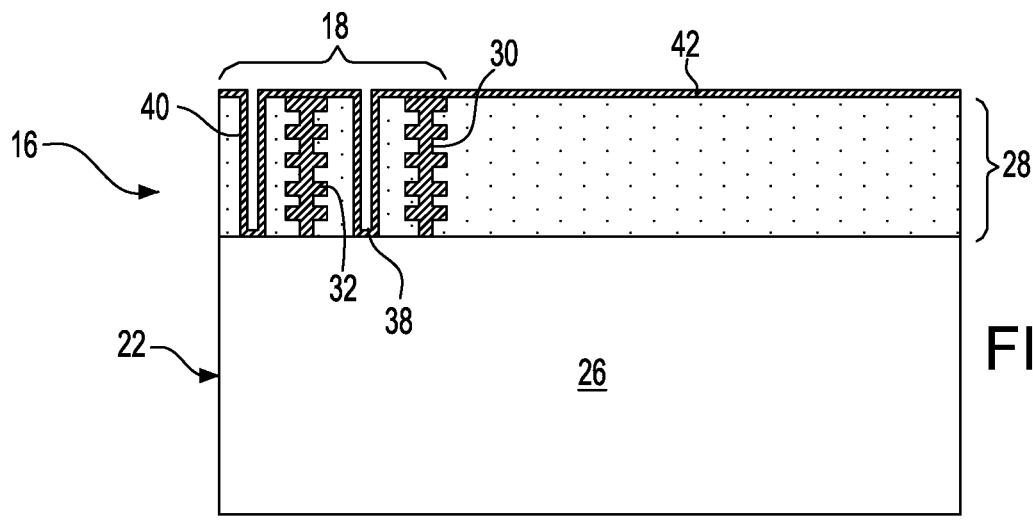
Figure 15:
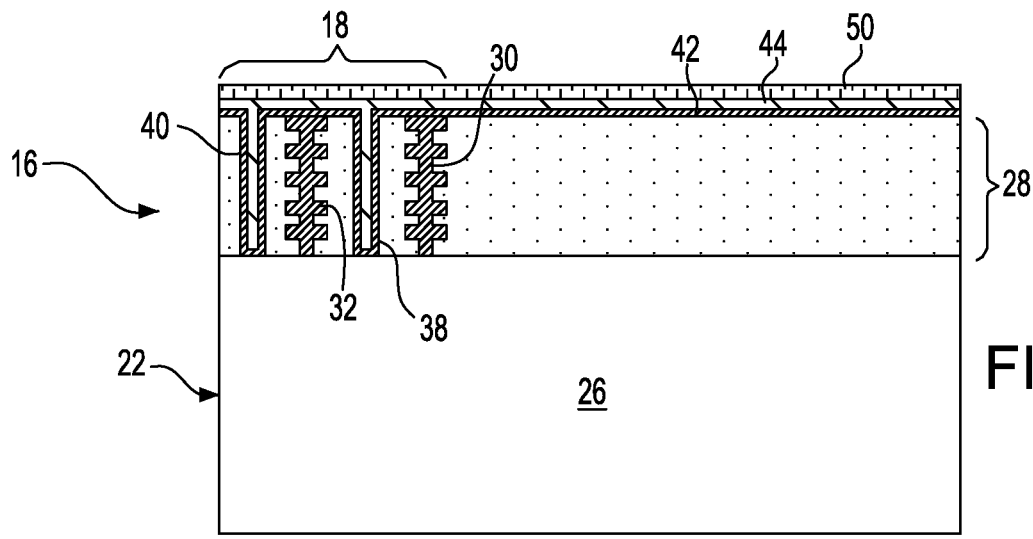
Figure 16:
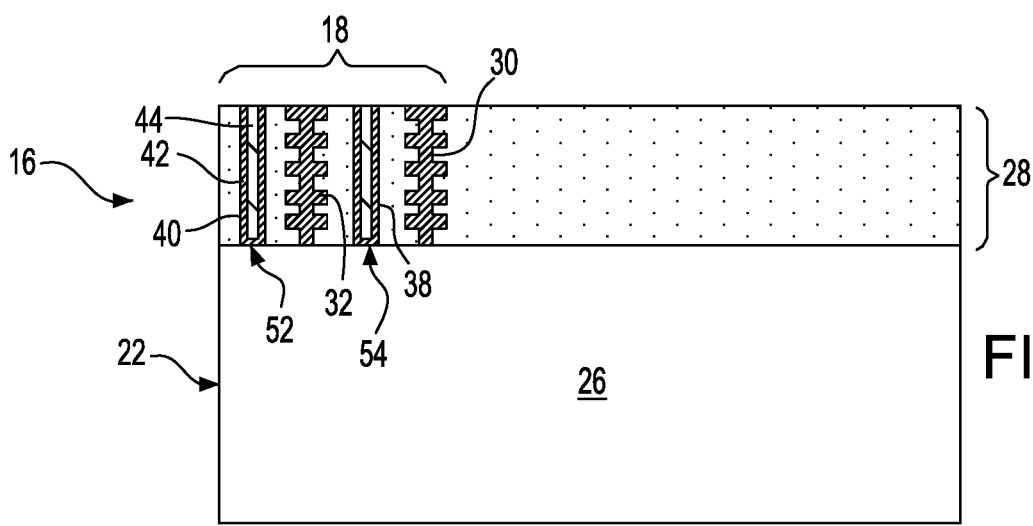

A preferred implementation of this exemplary embodiment is illustrated in FIGS. 14 to 16. For the purpose of illustration and not limitation, semiconductor device 16 is used to illustrate this preferred implementation but it should be understood that the other semiconductor devices 16A-E could also be used. FIG. 14 is identical to the previously described FIG. 11 where the barrier layer 42, such as silicon nitride, has been deposited.

Referring to FIG. 15, ion exchangeable glass 44 has been deposited as described previously with respect to FIG. 12. In addition, potassium in the form of potassium oxide ($K_2O$) may be deposited over the ion exchangeable glass 44. The semiconductor device 16 may then be heated to about 300° C. to cause potassium ions from the potassium oxide 50 to diffuse into the trenches 38, 40 and replace the sodium ions. Depending on the heating time, the potassium ions may diffuse down into the entire trenches 38, 40 (preferred) or may diffuse down only partly into the trenches 38, 40. The surface of the metallization layers 28 then may be planarized to remove the over layers of potassium 50, barrier 42 and ion exchangeable glass 44. The resulting structure is shown in FIG. 16 comprising compression zones 46, 48 formed by the ion exchangeable glass 44.

In another exemplary embodiment, a material such as tantalum or tungsten may be deposited in the trench. This metal layer may be in contact with a second layer of a low temperature oxide also deposited in the trench. The order of the deposition of the tantalum or tungsten and the low temperature oxide does not matter. That is, the tantalum or tungsten could be deposited first and then the low temperature oxide or the low temperature oxide and then the tantalum or tungsten. The layers of tantalum or tungsten and the low temperature oxide should fill the trench. The low temperature oxide could be silicon dioxide and may be deposited by plasma enhanced chemical vapor deposition. Other oxides are also possible. The low temperature oxide would be full of moisture so that upon heating above about 200° C., the moisture would be a source for oxygen to create a TaOx or WOx that would have a volumetric increase creating a very compressive stress. The metal oxide, TaOx or WOx, takes up more space than the original metal and this volumetric increase creates the compressive stress. An alternative embodiment may be to deposit tantalum or tungsten to fill the trench but without the low temperature oxide. The deposited metal would be oxidized by heating above 200° C. in an ambient with oxygen.

In another exemplary embodiment, the compressive stress may be created by compressive silicon nitride formed in the trenches 38, 40. Compressive silicon nitride may be created by flowing hydrogen during plasma enhanced deposition of the silicon nitride.

In another exemplary embodiment, the material may be an oxide having a high coefficient of thermal expansion (CTE). The high CTE oxide may be tensile and causes surrounding areas to be in compression. As noted previously, the coefficient of thermal expansion of a silicon oxide may be varied by varying the method of deposition. In one example, a silicon oxide may be deposited to have a CTE of about 4 E-6 which may be deposited into a silicon nitride layer having a CTE of about 3.3 E-6. In another example, a silicon oxide may be deposited to have a CTE of about 4 E-6 which may be deposited into a silicon oxide having a CTE or about 1 E-6 or 2E-6.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A semiconductor device comprising:
a substrate having integrated circuits;
a plurality of metallization layers on the substrate, the plurality of metallization layers having a peripheral region adjacent to a kerf region of the semiconductor device and containing a crack stop structure extending through the plurality of metallization layers;
a trench extending through the plurality of metallization layers and adjacent to the crack stop structure, the trench filled with a material that creates compressive stresses between the filled trench and the adjacent metallization layers to form a compressive zone adjacent to the crack stop structure.

2. The semiconductor device of claim 1 wherein the material is an ion exchangeable glass having potassium or sodium ions.

3. The semiconductor device of claim 1 wherein the material is an oxide of tantalum or tungsten.

4. The semiconductor device of claim 1 wherein the material is silicon nitride that is in compression.

5. The semiconductor device of claim 1 wherein the material is a high coefficient of thermal expansion oxide compared to the coefficient of thermal expansion of the metallization layers that creates a compressive stress between the trench and the adjacent metallization layers.

6. The semiconductor device of claim 1 wherein the material is a low coefficient of thermal expansion oxide compared to the coefficient of thermal expansion of the metallization layers that creates a compressive stress between the trench and the adjacent metallization layers.

7. The semiconductor device of claim 1 further comprising a second crack stop structure in the peripheral region.

8. The semiconductor device of claim 1 further comprising a liner in the trench between the metallization layers and the material that fills the trench.

9. The semiconductor device of claim 1 further comprising a second trench adjacent to the crack stop structure, the second trench filled with a material that creates a compressive stress between the second trench and the adjacent metallization layers to form a second compressive zone adjacent to the crack stop structure.

10. A semiconductor device comprising:
a substrate having integrated circuits;
a plurality of metallization layers comprising alternating layers of metal and dielectric on the substrate, the plurality of metallization layers having a peripheral region adjacent to a kerf region of the semiconductor device and containing a crack stop structure extending through the plurality of metallization layers, the crack stop structure comprising a plurality of vertically aligned and stacked metal-filled vias;
a trench extending through the plurality of metallization layers and adjacent to the crack stop structure, the trench filled with a material that creates compressive stresses between the filled trench and the adjacent metallization layers to form a compressive zone adjacent to the crack stop structure.

11. The semiconductor device of claim 10 further comprising a second trench adjacent to the crack stop structure, the second trench filled with a material that creates a compressive stress between the second trench and the adjacent metallization layers to form a second compressive zone adjacent to the crack stop structure.

* * * * *